(12) United States Patent
Meunier-Beillard et al.

(10) Patent No.: US 7,939,854 B2
(45) Date of Patent: May 10, 2011

(54) SEMICONDUCTOR DEVICE WITH A BIPOLAR TRANSISTOR AND METHOD OF MANUFACTURING SUCH A DEVICE

(75) Inventors: Philippe Meunier-Beillard, Kortenberg (BE); Raymond James Duffy, Leuven (BE); Prabhat Agarwal, Brussels (BE); Godfridus Adrianus Maria Hurkx, Best (NL)

(73) Assignee: NXP, B.V., Eindhoven (NL)

( * ) Notice: Subject to any disclaimer, the term of this patent is extended or adjusted under 35 U.S.C. 154(b) by 395 days.

(21) Appl. No.: 12/088,719

(22) PCT Filed: Sep. 22, 2006

(86) PCT No.: PCT/IB2006/053446
§ 371 (c)(1),
(2), (4) Date: Apr. 4, 2008

(87) PCT Pub. No.: WO2007/036861
PCT Pub. Date: Apr. 5, 2007

(65) Prior Publication Data
US 2008/0203434 A1      Aug. 28, 2008

(30) Foreign Application Priority Data

Sep. 30, 2005   (EP) .................................... 05109046

(51) Int. Cl.
*H01L 29/73*     (2006.01)

(52) U.S. Cl. ............................. 257/197; 257/E29.174
(58) Field of Classification Search .................. 257/191, 257/192, 197–200, 591–592, E29.174; 438/328, 438/340, 478
See application file for complete search history.

(56) References Cited

U.S. PATENT DOCUMENTS

| 6,753,234 | B1 * | 6/2004 | Naem | 438/318 |
| 6,759,696 | B2 * | 7/2004 | Huizing et al. | 257/195 |
| 2002/0024061 | A1 * | 2/2002 | Kondo et al. | 257/198 |
| 2003/0006486 | A1 * | 1/2003 | Klein et al. | 257/592 |

FOREIGN PATENT DOCUMENTS

WO     2004077570 A1    9/2004

* cited by examiner

*Primary Examiner* — Nathan W Ha

(57) ABSTRACT

The invention relates to a semiconductor device with a substrate and a semiconductor body of silicon comprising a bipolar transistor with an emitter region, a base region and a collector region which are respectively of the N-type conductivity, the P-type conductivity and the N-type conductivity by the provision of suitable doping atoms, wherein the base region comprises a mixed crystal of silicon and germanium, the base region is separated from the emitter region by an intermediate region of silicon having a doping concentration which is lower than the doping concentration of the emitter region and with a thickness smaller than the thickness of the emitter region, and the emitter region comprises a sub-region comprising a mixed crystal of silicon and germanium which is positioned at the side of emitter region remote from the intermediate region.

12 Claims, 4 Drawing Sheets

SEMICONDUCTOR DEVICE WITH A BIPOLAR TRANSISTOR AND METHOD OF MANUFACTURING SUCH A DEVICE

The invention relates to a semiconductor device with a substrate and a semiconductor body of silicon comprising a bipolar transistor with an emitter region, a base region and a collector region which are respectively of the n-type conductivity, the p-type conductivity and the n-type conductivity by the provision of suitable doping atoms, wherein the base region comprises a mixed crystal of silicon and germanium, the base region is separated from the emitter region by an intermediate region of silicon having a doping concentration which is lower than the doping concentration of the emitter layer and with a thickness smaller than the thickness of the emitter region and the emitter region comprises a sub-region comprising a mixed crystal of silicon and germanium which is positioned at the side of emitter region remote from the intermediate region. Such a device, in which the emitter comprises a monocrystalline region, is suitable for high-frequency applications. The invention also relates to a method of manufacturing such a device. A monocrystalline emitter region is easily obtained by forming the emitter region in an epitaxial growth process.

Such a device and method are known from United States patent U.S. Pat. No. 6,759,696 that has been published on Jul. 6, 2004. In said document, it disclosed that both base and emitter region are in-situ doped, i.e. during their epitaxial growth by respectively boron and phosphor atoms. The base region is provided with a mixed crystal of silicon and germanium in order to improve the speed. The surface part of the (monocrystalline) emitter region is provided with a mixed crystal of silicon and germanium, the latter material having a higher intrinsic carrier concentration than the remainder of the emitter region which comprises silicon and the Si—Ge region is positioned outside the depletion region and being doped such that Auger recombination occurs. In this way, a fast bipolar transistor is obtainable which enables the current amplification to be very accurately adjustable via the base current. A drawback of the known device is that its speed requires improvement for some applications requiring a very high $f_T$ (=cut-off frequency).

Therefore, it is an object of the present invention to provide a device of the kind mentioned in the opening paragraph, which has an improved high-frequency behavior.

To achieve this, in accordance with the invention, a device of the type mentioned in the opening paragraph is characterized in that the sub-region comprising the mixed crystal of silicon and germanium extend substantially through the whole emitter region up to the interface with the intermediate region and the doping atoms of the emitter region are arsenic atoms. The invention is based on the following surprising recognitions. Firstly, the diffusion of more specifically n-type dopants appears to be enhanced in a material comprising a mixed crystal of Si and Ge compared to the diffusion speed in silicon. Thus, by positioning the Si—Ge sub-region up to the intermediate region, a steeper profile of the n-type doping is obtained. Such a steep profile allows for a faster response speed of the transistor and thus for an improved high-frequency behavior. The above effect appears to be much larger for arsenic atoms than for phosphorus. Thus a considerable increase of the $f_T$ is possible in a device according to the invention.

Optimal results in this respect are obtained for a germanium content of the emitter region lying between about 20 and 100 at. %. In practice, a suitable germanium content lies around 40 at. %. It is to be noted that it is not necessary for the effect of the present invention that the germanium-content is equally high throughout the whole emitter region. However, a uniform germanium content is not only effective but also easy to realize since the gas phase conditions during epitaxial growth are kept constant most easily.

The effect of the present invention is obtainable in case of an in situ doped emitter region, i.e. the mixed crystal region of silicon and germanium is epitaxially grown while a gas like $PH_3$. However, in a preferred embodiment the arsenic atoms are provided in the emitter regions by an ion implantation. If the arsenic atoms, as implanted are positioned in a region more remote from the interface with the intermediate region, the full effect of the diffusion enhancement in the Si—Ge region combined with the retardation of the diffusion in the Si containing intermediate region are obtainable, i.e. a very steep profile of the arsenic atoms at the interface with or within the intermediate region is obtained.

Moreover, in this way, the end of range defects of the arsenic implant are kept at a safe distance from the base-emitter junction. Preferably, said end of range damage is kept at a distance of e.g. 20 nm from the base-emitter junction. This allows for optimal relaxation of the stress of the Si—Ge region, which in turn allows for a high Ge content. The latter implies that the enhancement of the diffusion of the arsenic atoms is largest. Moreover, the end of range damage also enhances the diffusion of the arsenic atoms. After a suitable thermal treatment, e.g. a rapid thermal annealing process, the final very steep arsenic profile in the emitter region is obtained which reaches till the interface with the intermediate region or till slightly within the intermediate region.

The present invention further has recognized that the Si—Ge in a, boron doped, p-type region retards the boron diffusion compared to the diffusion of boron in silicon as in the intermediate region. Thus, in a device according to the invention, not only the n-type profile of the emitter has a very steep change but also the p-type profile of the base region. The latter also favors the high-frequency behavior and thus a high $f_T$. In a favorable embodiment the base region is doped with boron and provided with carbon atoms with a concentration that is at least comparable with the concentration of the boron atoms. It has been found that the presence of carbon atoms also retards the boron diffusion and thus also contributes to the steepness of the boron transition and thus to the speed of the transistor. Moreover, carbon atoms in said concentration range do not adversely effect any other property of the bipolar transistor.

Preferably the width of the germanium containing region and the width of the carbon-containing region in the base region are somewhat wider than the width of the region comprising the boron atoms. In this way the retardation effect is optimal. For the carbon atoms, this can be realized advantageously by e.g. doping a part, e.g. half, of the intermediate region that borders the base region by carbon as well. A larger part than this is not suitable since the carbon enhances the arsenic diffusion and the arsenic profile of the emitter region will extend a small amount into the intermediate region.

The intermediate region may be of the n-type or p-type conductivity as long as its doping concentration is low enough. It may be an intrinsic region as well. Preferably, a thin sacrificial silicon region is formed on top of the emitter region. This has the advantage that the strain in the structure can be reduced and that said region could be converted by reaction with a metal into a metal silicide functioning as a contact region for the emitter.

A method of manufacturing a semiconductor device with a substrate and a semiconductor body of silicon comprising a bipolar transistor with an emitter region, a base region and a collector region which are respectively of the n-type conductivity, the p-type conductivity and the n-type conductivity by the provision of suitable doping atoms, wherein the base region is provided with a mixed crystal of silicon and germanium, the base region is separated from the emitter region by an intermediate region of silicon having a doping concentration which is lower than the doping concentration of the emitter layer and with a thickness smaller than the thickness of the emitter region and the emitter region is provided with a sub-region comprising a mixed crystal of silicon and germanium which is positioned at the side of emitter region remote from the intermediate region, is according to the present invention characterized in that the sub-region comprising the mixed crystal of silicon and germanium is extended substantially through the whole emitter region up to the interface with the intermediate region and for the doping atoms of the emitter region arsenic atoms are chosen. In this way, a semiconductor device according to the invention is obtained in a simple manner.

Preferably the germanium content of the emitter region is chosen between about 20 and 100 at. %. Optimal results are possible at a Ge content of about 40 at. %. In a preferred embodiment the arsenic atoms are provided in the emitter regions by ion implantation. Preferably the energy of the ion implantation is chosen such that the arsenic atoms as implanted are positioned in the emitter region remote from the intermediate region. Preferably a thin silicon region is grown on top of the silicon-germanium emitter region, which subsequently is transformed into a metal silicide contact region.

These and other aspects of the invention will be apparent from and elucidated with reference to the embodiments described hereinafter.

In the drawings.

The Figures are diagrammatic and not drawn to scale, particularly the dimensions in the thickness direction being exaggerated for clarity. Semiconductor regions of the same conductivity type are generally hatched in the same direction. Like reference numerals refer to like regions whenever possible.

Figure 1:
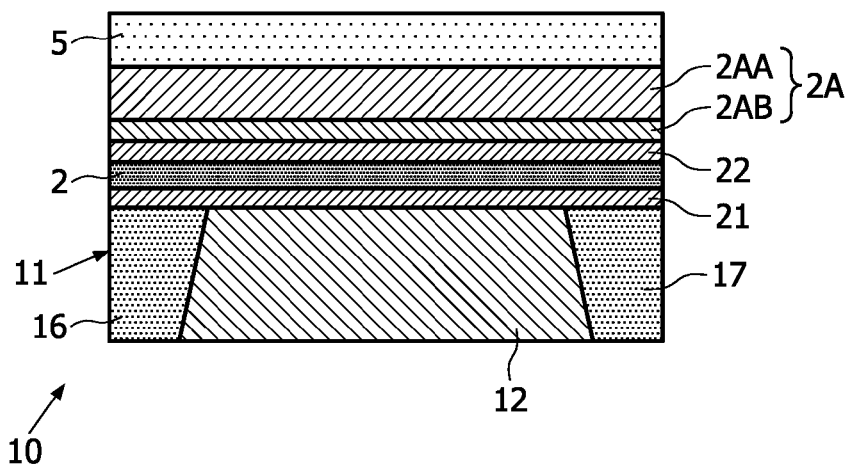
FIGS. 1 through 6 are diagrammatic, cross-sectional views, at right angle to the thickness direction, of a semiconductor device according to the invention at successive stages in the manufacture using a method in accordance with the invention.
Figure 2:
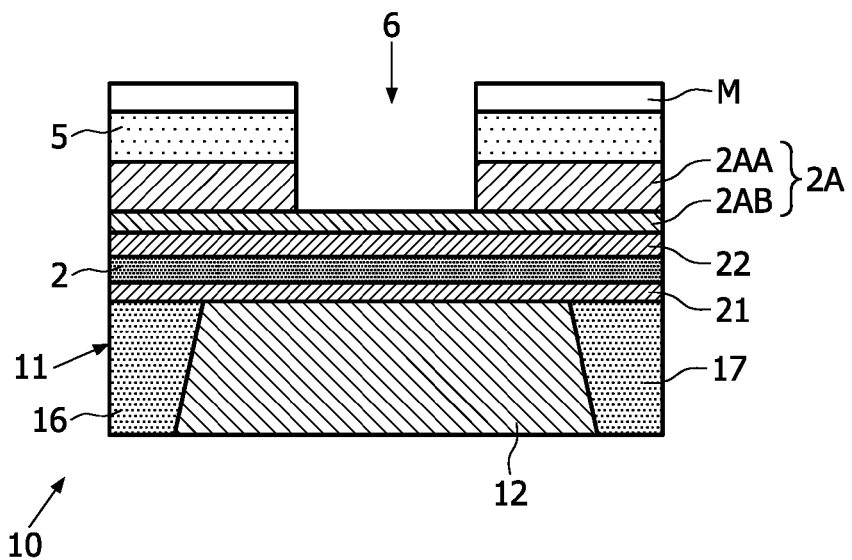
Figure 3:
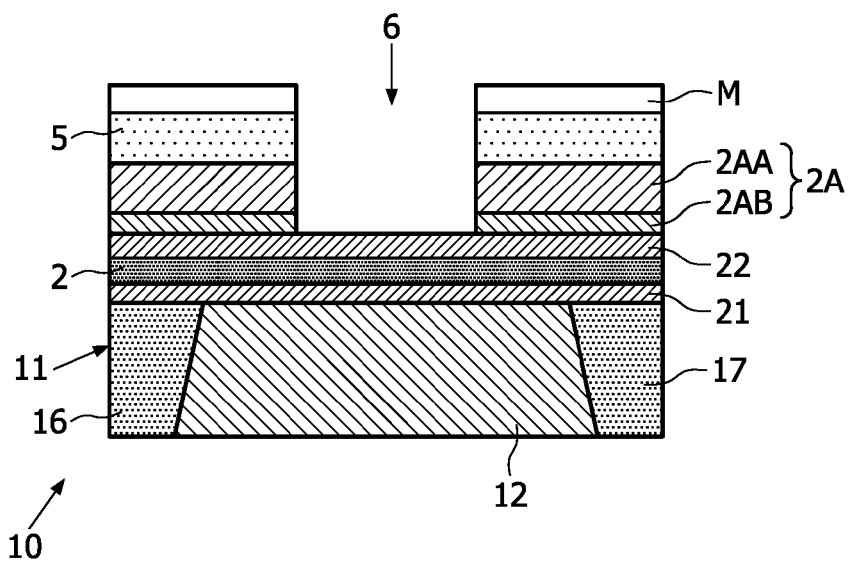
Figure 4:
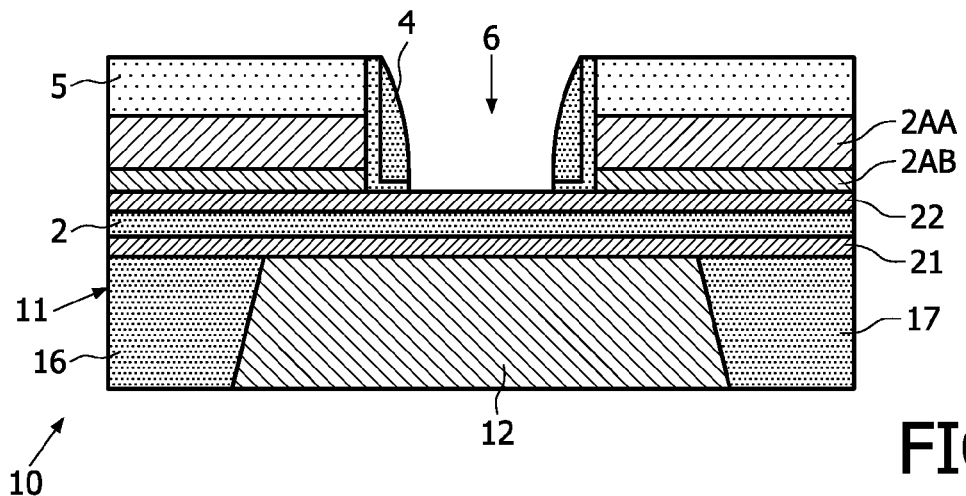

FIGS. 1 through 6 are diagrammatic, cross-sectional views, at right angle to the thickness direction, of a semiconductor device according to the invention at successive stages in the manufacture using a method in accordance with the invention. The—almost completely—finished device 10 (see FIG. 6) of this example comprises a semiconductor body 11 with an n-type silicon substrate 12 and a semiconductor layers structure deposited thereon with a bipolar transistor. The—in this example discrete—transistor has an n-type emitter region 1, a p-type base region 2, and an n-type collector region 3, which regions 1,2,3 are provided with a first, second, and third connection conductor region 100,200,300. An intermediate region 22 is positioned between base 2 and emitter 1. The base region 2 comprises a mixed crystal of silicon and germanium with a germanium content of about 20 at.% and has in this example a doping in the form of a boron spike with a concentration of about $1 \times 10^{18}$ at/cm$^3$ to $5 \times 10^{19}$ at/cm$^3$. The intermediate region 22 comprises silicon and is un-doped or intrinsic and its doping concentration may be in the range $1 \times 10^{17}$ at/cm$^3$ to $1 \times 10^{18}$ at/cm$^3$. The same holds for a transition layer 21 positioned between the base region 2 and the collector region 3 that is here within the substrate 12. The connection conductors 100,200 of the emitter region 1 and the base region 2 here comprise a silicide of e.g. cobalt or nickel, whereas the connection conductor 300 of the collector region 3 here comprises aluminum. The emitter region 1 here comprises a monocrystalline region 1 obtained by epitaxy which is separated from a base connection region 2A by means of spacers 4 and which is polycrystalline above isolating regions 5 of silicondioxide. The device 10 further comprises here sunken isolating regions 16,17 comprising silicondioxide.

According to the invention the emitter region 1 comprises substantially through its whole thickness a mixed crystal of silicon and germanium with a germanium concentration between 20 and 100 at.%, in this example 40 at.%. Furthermore, the emitter region 1 is doped with arsenic atoms. Thanks to these conditions the doping profile shows near the border between the emitter 1 and intermediate region 22 a very steep profile that favors the high-frequency properties of the transistor. Preferably, the doping of the emitter region 1 is, as in this example, obtained by ion implantation, the as implanted profile of arsenic atoms being positioned in the upper half of the emitter region 1, whereas after a thermal annealing treatment the arsenic atoms are not only made electrically active but also reaches a position close to or slightly within the intermediate region 22, indicated here by region 1A.

In this example the base connection region 2A comprises apart from the polycrystalline silicon region 2AA a further conducting region 2B of here tantalum nitride positioned below the poly-Si region 2AA and toward which the latter can be etched selectively. The emitter region 1 has in this example an T-shaped cross-section and has functioned as a mask for forming highly doped regions 2C formed in the base region 2 by means of ion implantation.

The lateral dimensions of the device of this example are 1 μm×10 μm. The emitter region has a doping concentration of $10^{20}$ at/cm$^3$ and a thickness of 30 nm. The base region 2 has a thickness of about 20 nm and the bordering layers 21,22 have the same thickness. The device 10 of this example may be manufactured as follows using a method according to the invention. The base region 2 comprises apart from the Si—Ge mixed crystal and the boron doping a carbon doping of about $10^{20}$ at/cm$^3$. Both the Si—Ge and the carbon atoms retard the diff-usion of boron atoms. For that reason the boron profile at the border with the intermediate region 22 is also very steep which favors the high-speed properties of the transistor.

The starting point (see FIG. 1) is formed by an n-type silicon substrate 12 in which here so called STI (=Shallow Trench Isolation) regions 16,17 are formed. Part of the substrate 12 lying below these regions 16,17 has been omitted in the drawing for the sake of simplicity. Thereon are deposited using epitaxy the epitaxial layers 21,2,22 whereby the thicknesses, compositions and doping concentrations are chosen as indicated above by adjusting the appropriate gas flows in the growth reactor.

Next, in this example, a further layer structure is deposited comprising subsequently a conducting layer 2AB of tantalum nitride, a polycrystalline silicon layer 2AA and an insulating layer 5 of silicondioxide. The first layer 2AB is formed e.g. by sputtering and the other layers 2AA,5 by CVD (=Chemical Vapor Deposition) and the thicknesses are respectively 10, 100 and 50 nm.

Subsequently (see FIG. 2) using a photolithographic mask M an opening 6 is formed in the layers 5,2AA, e.g. with a dry etch process, the layer 2AB functioning as an etch stop.

Then (see FIG. 3) the layer 2AB is etched in the opening 6 using a further, e.g. wet, etching process, the silicon of layer 22 finctioning as an etch stop.

After removal of the mask M (see FIG. 4) spacers 4 are formed comprising two thin layers, the lower one being of an oxide the higher one being of a nitride and respectively 10 and 50-100 nm thick. These layers are deposited uniformly and subsequently the horizontal parts are removed by an anisotropical etching process.

Next (see FIG. 5) an un-doped—at least not intentionally doped—layer 1 is deposited comprising a mixed crystal of silicon and germanium with a Ge content of 40 at. % using a non-selective (or differential) epitaxial growth process. Preferably a thin sacrificial silicon region 99 is formed on top of the emitter region 1.

Within the opening 6 the layer 1 (and layer 99 if present) becomes monocrystalline, outside said opening 6 and above siliconoxide layer 5, the layer 1 becomes polycrystalline. Then an ion implantation I of arsenic is performed using an energy of 1 keV and with a dose (flux) of $1\times10^{15}$ at/cm$^2$. These conditions are such that the as implanted As profile is within the upper half of layer 1. After an annealing treatment, here a RTA (=Rapid Thermal Anneal) at 1050° C. in the form of a spike anneal, the arsenic atoms diff-use, enhanced by the SiGe mixed crystal of layer 1 and retarded by the Si of layer 22 through the whole thickness of the emitter layer 1 resulting in a thin out-diffused region 1A and having a very steep profile.

Subsequently (see FIG. 6) the emitter layer 1 is patterned by means of photolithography and etching. The width of the emitter 1 at is bottom is about 200 nm and at its top about 500 nm. Next, the highly doped regions 2C are formed by means of ion implantation, the emitter 1 being still provided with a mask not shown in the drawing and functioning as a mask.

Finally, the connection conductors 100, 200 are formed e.g. by depositing a nickel or cobalt layer which is made to react for silicide formation, the unreacted nickel or cobalt being removed by etching. Also connection conductor 300 is formed. It is to be noted that the collector 3 also can be contacted at the upper surface of the device 10. This can be done if the device 10 is a discrete device but in particular if the device 10 forms an IC (=Integrated Circuit), e.g. a bipolar or BiMOS or BiCMOS IC. After applying a separation technique like sawing or etching individual devices 10 can be obtained that are suitable for mounting.

Figure 7:
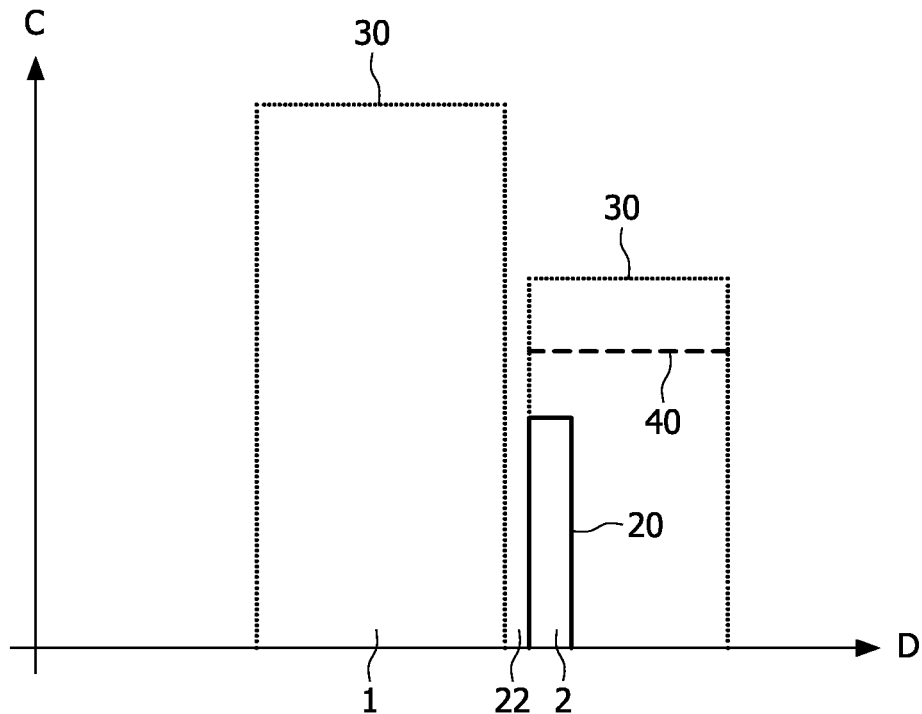
FIGS. 7 through 9 are diagrammatic, cross-sectional profiles, at right angle to the thickness direction, of the composition of a semiconductor device according to the invention a in successive relevant stages in the manufacture using a method in accordance with the invention.
Figure 8:
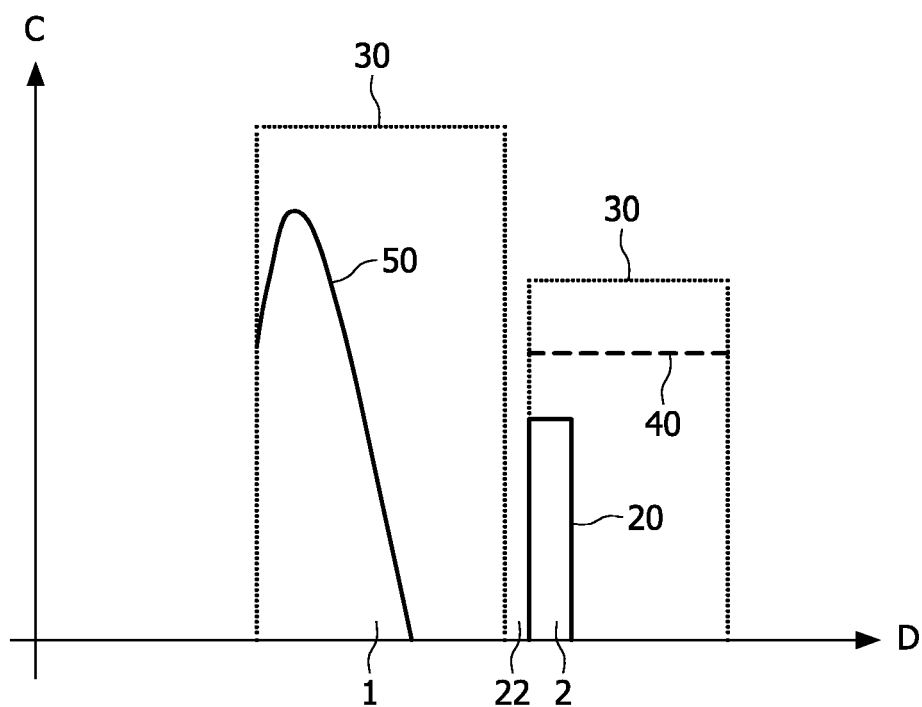
Figure 9:
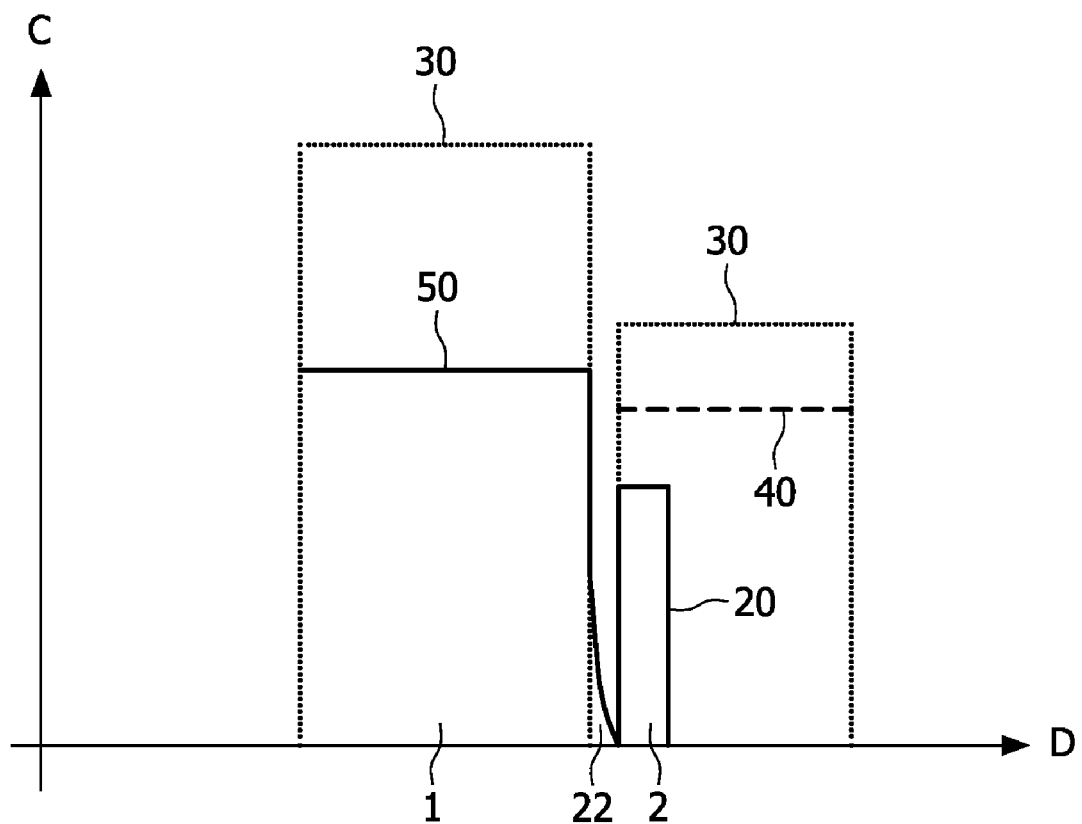

FIGS. 7 through 9 are diagrammatic, cross-sectional profiles, at right angle to the thickness direction, of the composition of a semiconductor device according to the invention a in successive relevant stages in the manufacture using a method in accordance with the invention. In these Figures C stands for the composition (for mixed crystal regions) or concentration (for doping atoms or additives) and D stands for the thickness direction, the separate regions 1,2,22 being indicated with their reference numerals along the D axis. Curve 30 shows the Ge content in the D direction, curve 20 shows the boron concentration, curve 40 shows the carbon concentration and curve 50 shows the arsenic concentration.

Figure 5:
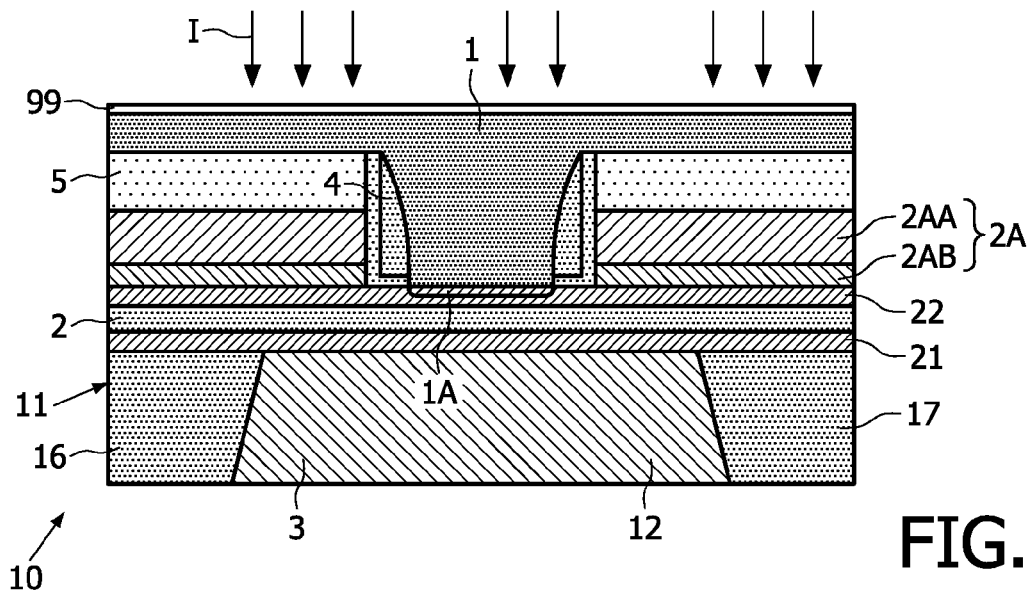
Figure 6:
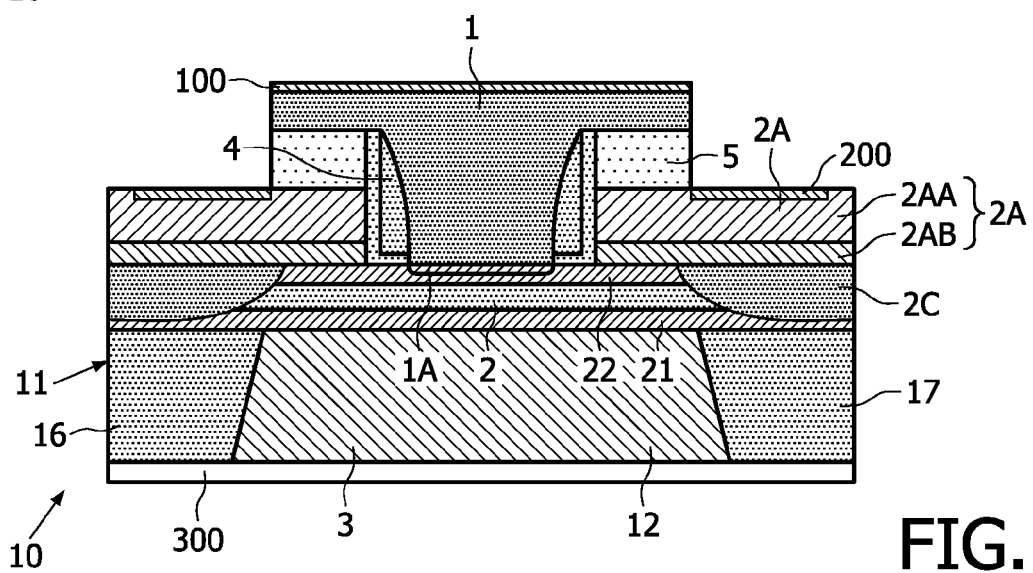

FIG. 7 shows the stage of manufacturing corresponding with FIG. 5 but before the ion implantation I and the germanium content 30, the boron concentration 20 and carbon concentration 40 being as discussed above.

FIG. 8 shows the device 10 immediately after the ion implantation I of FIG. 5 and thus the arsenic profile 50 as implanted.

FIG. 9 shows the very steep arsenic profile 50 obtained after the RTA step discussed above. These Figures, and in particular FIG. 9, illustrate the very steep profiles of both the arsenic in the emitter 1 and the boron in the base 2 at the location of the intermediate region 22 and thus how a device with a bipolar transistor is obtained having excellent high-frequency properties.

The invention is not limited to the above-mentioned examples, and within the scope of the invention many modifications and variations are possible to those skilled in the art. For example, composition and thicknesses for the different (semiconductor) layers or regions may be selected which differ from those mentioned in the examples. It is also possible to use different deposition techniques, such as MBE (=Molecular Beam Epitaxy) or sputtering of PVD (Physical Vapor Deposition).

The method according to the invention may be very well applied to a more complex device than a single bipolar transistor. The device may comprise a number of different active or passive electronic or semiconductor components. The transistor may also form part of a BI(C)MOS IC (=Bipolar (Complementary) Metal Oxide Semiconductor Integrated Circuit).

The invention claimed is:

1. Semiconductor device with a substrate and a semiconductor body of silicon comprising a bipolar transistor with an emitter region, a base region and a collector region which are respectively of the n-type conductivity, the p-type conductivity and the n-type conductivity by the provision of suitable doping atoms, wherein the base region comprises a mixed crystal of silicon and germanium, the base region is separated from the emitter region by an intermediate region of silicon having a doping concentration which is lower than the doping concentration of the emitter region and with a thickness smaller than the thickness of the emitter region and the emitter region comprises a sub-region comprising a mixed crystal of silicon and germanium which is positioned at the side of emitter region remote from the intermediate region, characterized in that the sub-region comprising the mixed crystal of silicon and germanium extend substantially through the whole emitter region up to the interface with the intermediate region and the doping atoms of the emitter region are arsenic atoms.

2. Semiconductor device according to claim 1, characterized in that the germanium content of the emitter region is between about 20 and 100 at. %.

3. Semiconductor device according to claim 2, characterized in that the germanium content of the emitter region is about 40 at. %.

4. Semiconductor device according to claim 1, characterized in that the arsenic atoms are provided in the emitter regions by an ion implantation.

5. Semiconductor device according to claim 4, characterized in that the energy of the ion implantation is chosen such that the arsenic ions as implanted are positioned in the emitter region remote from the intermediate region.

6. Semiconductor device as claimed in claim 1, characterized in that the base region is doped with boron atoms and provided with carbon atoms with a concentration that is at least comparable with the concentration of the boron atoms.

7. Semiconductor device as claimed in claim 1, characterized in that the emitter region is contacted by a metal silicide formed of a sacrificial silicon layer on top of the emitter region.

8. A method of manufacturing a semiconductor device with a substrate and a semiconductor body of silicon comprising a bipolar transistor with an emitter region, a base region and a collector region which are respectively of the n-type conductivity, the p-type conductivity type and the n-type conductivity by the provision of suitable doping atoms, wherein the base region is provided with a mixed crystal of silicon and germanium, the base region is separated from the emitter region by an intermediate region of silicon having a doping concentration which is lower than the doping concentration of the emitter region and with a thickness smaller than the thickness of the emitter region and the emitter region is provided with a sub-region comprising a mixed crystal of silicon and germanium which is positioned at the side of emitter region remote from the intermediate region, characterized in that the sub-region comprising the mixed crystal of silicon and germanium is extended substantially through the whole emitter region up to the interface with the intermediate region and for the doping atoms of the emitter region arsenic atoms are chosen.

9. Method according to claim 8, characterized in that the germanium content of the emitter region is chosen between about 20 and 100 at. %.

10. Method according to claim 8, characterized in that the arsenic atoms are provided in the emitter region by ion implantation.

11. Method according to claim 10, characterized that the energy of the ion implantation is chosen such that the arsenic atoms as implanted are positioned in the emitter region remote from the intermediate region.

12. Method according to claim 8, characterized in that a thin sacrificial silicon region is grown on top of the emitter region which is converted with a metal to a metal silicide contact region.

* * * * *